（12）United States Patent
Shalev et al.

(10) Patent No.: US 8,179,291 B2
(45) Date of Patent: May 15, 2012

(54) METHOD AND SYSTEM FOR COMPRESSION OF LOGICAL DATA OBJECTS FOR STORAGE

(75) Inventors: Ori Shalev, Kiryat (IL); Jonathan Amit, Omer (IL)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/773,131

(22) Filed: May 4, 2010

(65) Prior Publication Data

US 2010/0277353 A1   Nov. 4, 2010

Related U.S. Application Data

(60) Provisional application No. 61/175,193, filed on May 4, 2009.

(51) Int. Cl.
*H03M 7/34* (2006.01)

(52) U.S. Cl. ............ 341/51; 341/50; 341/87; 709/203

(58) Field of Classification Search ............ 341/50, 341/51, 67, 87; 382/232; 709/203
See application file for complete search history.

(56) References Cited

U.S. PATENT DOCUMENTS

| | | | |
|---|---|---|---|
| 4,558,302 A | 12/1985 | Welch | |
| 4,560,976 A | 12/1985 | Finn | |
| 4,586,027 A | 4/1986 | Tsukiyama et al. | |
| 4,701,745 A | 10/1987 | Waterworth | |
| 4,876,541 A | 10/1989 | Storer | |
| 4,929,946 A * | 5/1990 | O'Brien et al. | 341/87 |
| 5,036,457 A * | 7/1991 | Glaser et al. | 703/22 |
| 5,384,567 A | 1/1995 | Hassner et al. | |
| 5,455,576 A * | 10/1995 | Clark et al. | 341/50 |
| 5,485,526 A * | 1/1996 | Tobin | 382/232 |
| 5,627,534 A | 5/1997 | Craft | |
| 5,652,878 A | 7/1997 | Craft | |
| 6,535,150 B1 * | 3/2003 | Ross | 341/67 |

FOREIGN PATENT DOCUMENTS

| | | |
|---|---|---|
| WO | 2007/138600 A2 | 12/2007 |
| WO | 2007/138601 A2 | 12/2007 |
| WO | 2007/138602 A2 | 12/2007 |

* cited by examiner

*Primary Examiner* — Jean B Jeanglaude
(74) *Attorney, Agent, or Firm* — Griffiths & Seaton PLLC

(57) ABSTRACT

There is provided a compression system configured to compress logical data objects into one or more accommodation blocks with a predefined size, and a method of operating thereof. The compression system includes a compression engine capable of compressing input data with the help of sequential encoding one or more input strings and a counter operatively coupled to the compression engine. The counter is configured to keep its ongoing value indicative of a number of input bytes in one or more strings successfully encoded into a given accommodation block; and, responsive to unsuccessful compression of a string into the given accommodation block, to provide the compression engine with information indicative of starting point in the input stream for encoding into the next accommodation block, thus giving rise to a "start indication".

25 Claims, 4 Drawing Sheets

METHOD AND SYSTEM FOR COMPRESSION OF LOGICAL DATA OBJECTS FOR STORAGE

CROSS-REFERENCES TO RELATED APPLICATIONS

This application relates to and claims priority from U.S. Provisional Patent Application No. 61/175,193 filed on May 4, 2009 incorporated herein by reference in its entirety.

FIELD OF THE INVENTION

This invention relates to computing systems, and, in particular, to methods and systems capable of compressing data to be stored in computing systems and networks thereof.

BACKGROUND OF THE INVENTION

With increasing demand for faster, more powerful and more efficient ways to store information, optimization of storage technologies is becoming a key challenge. Logical data objects (data files, image files, data blocks, etc.) may be compressed for transmission and/or storage. Data compression techniques are used to reduce the amount of data to be stored and/or transmitted in order to reduce the storage capacity and/or transmission time respectively. Compression may be achieved by using different compression algorithms known in the art, for example, by sequential data compression which takes a stream of data as an input and generates a usually shorter stream of output from which the original data can be restored (e.g. Lempel-Ziv type algorithms, run length encoding algorithms, arithmetic coding type algorithms, etc.). By way of non-limiting example, Lempel-Ziv type sequential algorithms compress strings of binary data of variable length into a fixed length compressed binary format. Lempel-Ziv type algorithms may be implemented using a history buffer that contains the most recent bytes or words of a file in the correct sequence. By repeated executions of a basic routine, new bytes are read as long as the sequence of incoming bytes is matched by a sequence in the history buffer.

The problems of effectively implementing sequential data compression have been recognized in the Prior Art and various systems have been developed to provide a solution, as for example:

U.S. Pat. No. 4,558,302 (Welch) discloses a compression method (commonly called a Lempel-Ziv-Welch data compression technique) utilizing a dictionary for storing commonly used data strings and searching that dictionary using hashing techniques.

U.S. Pat. No. 4,586,027 (Tsukiyama et al.) discloses a method of data compression and restoration wherein an input data string including repetitive data more in number than the specified value is transformed into a data string having a format including the first region where non-compressed data are placed, the second region including a datum representative of a data string section which has undergone the compression process and information indicative of the number of repetitive data, i.e., the length of the data string section, and control information inserted at the front and back of the first region indicative of the number of data included in the first region, said transformed data string being recorded on the recording medium, and, for data reproduction, the first and second regions are identified on the basis of the control information read out on the recording medium so that the compressed data string section is transformed back to the original data string in the form of repetitive data.

U.S. Pat. No. 4,560,976 (Finn) discloses a compression method wherein a stream of source characters with varying relative frequencies is encoded into a compressed stream of codewords, each having one, two or three subwords. The method comprises ranking the source characters by their current frequency of appearance, encoding the source characters having ranks no higher than a first number as one sub-word codewords, source characters having ranks higher than the first number but no higher than a second number as two sub-word codewords, and the remaining source characters as three sub-word codewords. The first number is changed and the second number is recalculated as required by the changing frequencies of the source characters to minimize the length of the stream of codewords.

U.S. Pat. No. 4,701,745 (Waterworth) discloses a data compression system including an input store for receiving and storing a plurality of bytes of data from an outside source. Data processing means for processing successive bytes of data from the input store include circuit means operable to check whether a sequence of bytes is identical with a sequence of bytes already processed, output means operable to apply to a transfer medium each byte of data not forming part of such an identical sequence, and an encoder responsive to the identification of such a sequence to apply to the transfer means an identification signal which identifies both the location in the input store of the previous occurrence of the sequence of bytes and the number of bytes in the sequence.

U.S. Pat. No. 4,876,541 (Storer) discloses a data compression system for encoding and decoding textual data, including an encoder for encoding the data and a decoder for decoding the encoded data. Both encoder and decoder have dictionaries for storing frequently-appearing strings of characters. Each string is identified by a unique pointer. The input data stream is parsed and matched with strings in the encoder dictionary using a novel matching algorithm. The pointer associated with the matched string is then transmitted to a remote location for storage or decoding. Thereafter, the encoder dictionary is updated to include new strings of data based on the matched string of data. The strings of data may be arranged using a modified least recently used queue. The decoder matches each unique pointer in the stream of compressed input data with a corresponding pointer in the decoder dictionary. The decoder then transmits the string of character data associated with the matched pointer, thereby providing textual data in original, uncompressed form. Thereafter, using the novel update and deletion algorithms, new strings of data are added to, and old strings of data are deleted from, the decoder dictionary, so as to ensure both encoder and decoder dictionaries contain identical strings of data.

U.S. Pat. No. 5,384,567 (Hassner et al.) discloses an apparatus and method for executing a sequential data compression algorithm suitable for use where data compression is required in a device (as distinguished from host) controller. A history buffer compresses an array of i identical horizontal slice units. Each slice unit stores j symbols to define j separate blocks in which the symbols in each slice unit are separated by exactly i symbols. Symbols in a string of i incoming symbols are compared by i comparators in parallel with symbols previously stored in the slice units to identify matching sequences of symbols. A control unit controls execution of the sequential algorithm to condition the comparators to scan symbols in parallel but in each of the blocks sequentially and cause matching sequences and non-matching sequences of symbols to be stored in the array. The parameters i and j are selected to limit the number of comparators required to achieve a desired degree of efficiency in executing the algorithm based upon a trade-off of algorithm execution speed versus hardware cost.

A priority encoder calculates from signals output by the slice units each j,i address in which a matching sequence is identified, but it outputs the address of only one (such as the smallest) of these addresses.

U.S. Pat. No. 5,627,534 (Craft) discloses a dual stage data lossless compressor for optimally compressing bit mapped imaged data. The first stage run length compresses data bits representing pixel positions along a scan line of a video image to data units of fixed length. The units alternate to represent runs of alternate video image data values. The run length compressed data units are subject to second stage compression using a sliding window Lempel-Ziv compressor. The output from the Lempel-Ziv compressor includes raw tokens of fixed length and compressed tokens of varying lengths. The combination of a run length precompressor and a sliding window Lempel-Ziv post compressor, in which the run length compressor output is a succession of data units of fixed length, provides an optimum match between the capabilities and idiosyncracies of the two compressors, and related decompressors, when processing business form data images. Furthermore, the asymmetric simplicity of Lempel-Ziv sliding window decompression and run length decompression simplicity leads to a decompression speed compatible with contemporary applications.

U.S. Pat. No. 5,652,878 (Craft) discloses a data compression apparatus and method for implementation of LZ algorithms in parallel hardware architecture. The apparatus includes a circuit for receiving a data element, a storage circuit for sequentially storing previously received data elements at sequentially addressed fixed locations, a circuit for comparing the received data element to the stored data elements to determine whether the received data element matches at least one of the stored data elements, and a circuit for generating an address of the matching stored data element.

SUMMARY OF THE INVENTION

As has been found by the inventors, there are certain problems of implementing sequential data compression for compressing a logical data object into one or more blocks with predefined size accommodating the compressed data, such accommodation blocks capable of being uncompressed independently. Non-limiting examples of compression of logical data objects into the predefined-size accommodation blocks are disclosed in International Applications WO2007138600, WO2007138601 and WO2007138602 published Dec. 12, 2007 and assigned to the assignee of the present application. The entire contents of these PCT applications are hereby incorporated by reference in their entirety.

In accordance with the nature of sequential compression, when compressing into predefined-size accommodation blocks, the encoded output shall be truncated at the block boundary. As the accommodation blocks shall be capable of being independently uncompressed, the string with truncated encoded output is considered as unsuccessfully encoded and requires re-encoding into the next accommodation block. Thus, in order to continue compressing, it is necessary to determine the beginning of this unsuccessfully compressed string within the input data stream, i.e. a starting point for encoding into the next accommodation block. A possible way to determine this starting point in the input stream is to decompress the respective accommodation block with truncated string into a temporary buffer and define the size of input strings successfully encoded in the previous accommodation block. This invention, in some of its aspects, is aimed to provide a novel solution facilitating more effective implementation of sequential data compression into predefined-size accommodation blocks, with no need in decompression of accommodation blocks in order to determine, in the input stream, where the unsuccessfully encoded string starts.

In accordance with certain aspects of the present invention, there is provided a compression system configured to compress logical data objects into one or more accommodation blocks with a predefined size. The compression system comprises a compression engine capable of compressing input data with the help of sequential encoding of one or more input strings and a counter operatively coupled to the compression engine. The counter is configured to keep its ongoing value indicative of a number of input bytes in one or more strings successfully encoded into a given accommodation block, and, responsive to unsuccessful compression of a string into the given accommodation block, to provide the compression engine with information indicative of starting point in the input stream for encoding into the next accommodation block, thus giving rise to a "start indication".

In accordance with further aspects of the present invention, the counter is further configured to obtain, with regard to each string compressed by the compression engine, information whether the compression of a given string into a given accommodation block is successful; responsive to successful compression of the given string into the given accommodation block, to add a value indicative of the actual number of input bytes in the given string to an ongoing counter value; and, responsive to unsuccessful compression of the given string into the given accommodation block, to generate the start indication informative of the overall actual number of input bytes in all strings successfully encoded into the given accommodation block.

In accordance with further aspects of the present invention, the counter may be further configured to provide the compression engine with respectively updated ongoing counter value responsive to successful compression of each given string into the given accommodation block.

In accordance with further aspects of the present invention, the compression system may further comprise an output buffer operatively coupled to the compression engine and to the counter. The output buffer may be divided into one or more output buffer blocks corresponding to one or more accommodation blocks and configured to accommodate encoded output data for further conveying to the respective accommodation block. Compressing a string into a given accommodation block is considered as unsuccessful if encoded output of the string has been truncated at the boundary of corresponding output buffer block; and/or encoded output of the string is expected to be truncated at the boundary of the corresponding output buffer block.

In accordance with further aspects of the present invention, the system may be at least partly integrated with a storage device and/or communication device and/or client device operable in a storage network. Additionally or alternatively, the system or part thereof may be operatively coupled in a serial manner to a storage device, and act as a transparent bridge in respect to the storing encoded data.

In accordance with further aspects of the present invention at least one string may comprise merely one character.

In accordance with further aspects of the present invention, compression of a string into a given accommodation block is considered as unsuccessful when encoded output of the string has been truncated at the boundary of the given block; and/or encoded output of the string is expected to be truncated at the boundary of the given block.

In accordance with other aspects of the present invention, there is provided a method of compressing a logical data objects into one or more accommodation blocks with a predefined size. The method comprises: a) compressing input data with the help of sequential encoding one or more input strings, thus giving rise to encoded output data; b) counting an ongoing value indicative of a number of input bytes in one or more strings successfully encoded into a given accommodation block; c) responsive to unsuccessful compression of a string into the given accommodation block, generating information indicative of starting point in the input stream for encoding into the next accommodation block, thus giving rise to a "start indication", wherein the generation provided without decompression of the given accommodation block; and starting compressing into a next accommodation block in accordance the generated start indication.

In accordance with further aspects of the present invention the method further comprises: obtaining with regard to each compressed string information whether the compression of a given string into a given accommodation block is successful; responsive to successful compression of the given string into the given accommodation block, adding a value indicative of the actual number of input bytes in the given string to the ongoing counter value; and responsive to unsuccessful compression of the given string into the given accommodation block, generating the start indication informative of the overall actual number of input bytes in all strings successfully encoded into the given accommodation block.

In accordance with further aspects of the present invention the system and method are operable with at least file access storage protocol and/or block mode access storage protocol.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", "generating", "counting" or the like, refer to the action and/or processes of a computer that manipulate and/or transform data into other data, said data represented as physical, such as electronic, quantities and/or said data are representing the physical objects. The term "computer" should be expansively construed to cover any kind of electronic device with data processing capabilities, as, for example, disclosed in the present application.

The operations in accordance with the teachings herein may be performed by a computer specially constructed for the desired purposes or by a general purpose computer specially configured for the desired purpose by a computer program stored in a computer readable storage medium.

Embodiments of the present invention are not described with reference to any particular programming language. It will be appreciated that a variety of programming languages may be used to implement the teachings of the inventions as described herein.

The references cited in the background teach many principles of sequential data compression that are applicable to the present invention. Therefore the full contents of these publications are incorporated by reference herein for appropriate teachings of additional or alternative details, features and/or technical background.

The term "logical data object (LO)" used in this patent specification should be expansively construed to include any types and granularities of data units used in a computing system and handled as one unit (e.g. data files, archive files, image files, database files, memory data blocks, stream data blocks, predefined segments of files, etc.).

Figure 1:
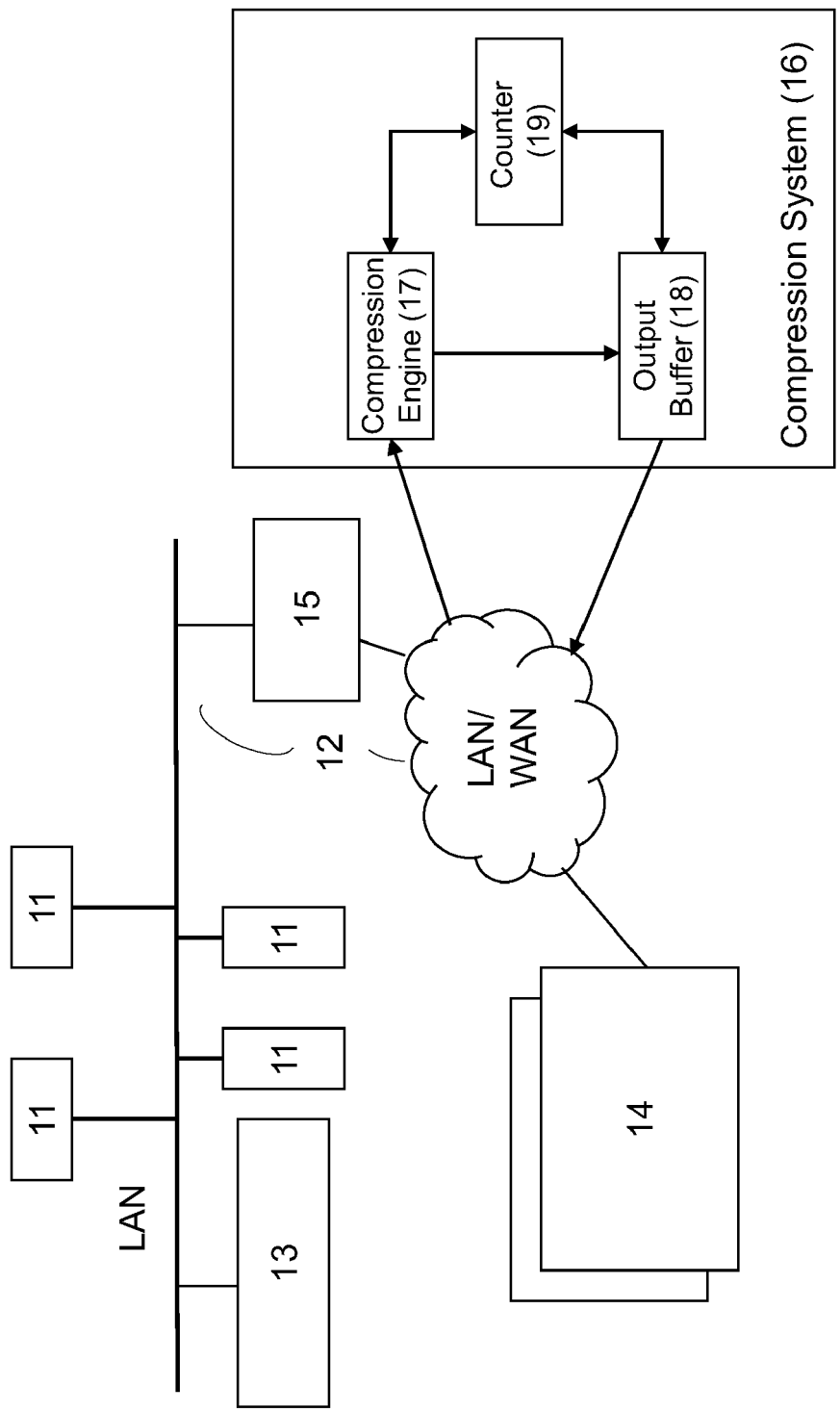
FIG. 1 illustrates a schematic block diagram of a computer system in accordance with certain embodiments of the present invention.

Bearing this in mind, attention is drawn to FIG. 1 illustrating a schematic diagram of a computer system in accordance with certain embodiments of the present invention. The logical data objects (LO) from different clients 11 (workstations, application servers, etc.) are transferred via network 12 to storage device(s) 13 (e.g. specialized NAS file servers, general purpose file servers, SAN storage, stream storage device, etc.) and/or 14. The network comprises one or more communication devices 15 (e.g. switch, router, bridge, etc.) facilitating the data transfer. The storage in the illustrated network may be wholly or partly implemented using block mode access and/or file mode access storage protocols. In file mode access the logical data objects (LOs) are constituted by files, and the network is IP network (e.g. local area network (LAN), wide area network (WAN), combination thereof, etc.). In block mode access embodiments, the logical data objects are constituted by data blocks and the network is Storage Area Network (SAN) implementing, for example, Fiber Channel or iSCSI protocols. In certain embodiments the storage device 14 may be directly connected to the client (e.g. server) via block mode access storage protocols (e.g. SCSI, Fiber Channel, etc.). Such Direct Access Storage includes, for example, the internally attached local disk drives or externally attached RAID (redundant array of independent disks) or JBOD (just a bunch of disks), etc.

At least part of the logical data objects may be stored in a compressed form. The compression is provided by a compression system 16. The compression system 16 may be a separate network entity operatively coupled to the clients/servers and the storage device 14 as illustrated in FIG. 1. Those versed in the art will readily appreciate that, likewise, the compression system or part thereof may be integrated with the clients, with the communication devices, with the storage device or any other devices on a physical and/or logical communication route between a client and respective storage location. Also, additionally or alternatively, the storage of compressed data or part thereof may be provided in a memory of the compression system and/or respective devices integrated with the compression system.

The compression system 16 comprises a compression engine 17 operatively coupled to an output buffer 18. As will be further detailed with reference to FIGS. 2-4, in accordance with certain embodiments of the present invention, the compression system further comprises a counter 19 operatively coupled to the compression engine and to the output buffer.

Those skilled in the art will readily appreciate that the invention is not bound by the configuration of FIG. 1; equivalent and/or modified functionality may be consolidated or divided in another manner and may be implemented in software, firmware, hardware, or any combination thereof.

Figure 2:
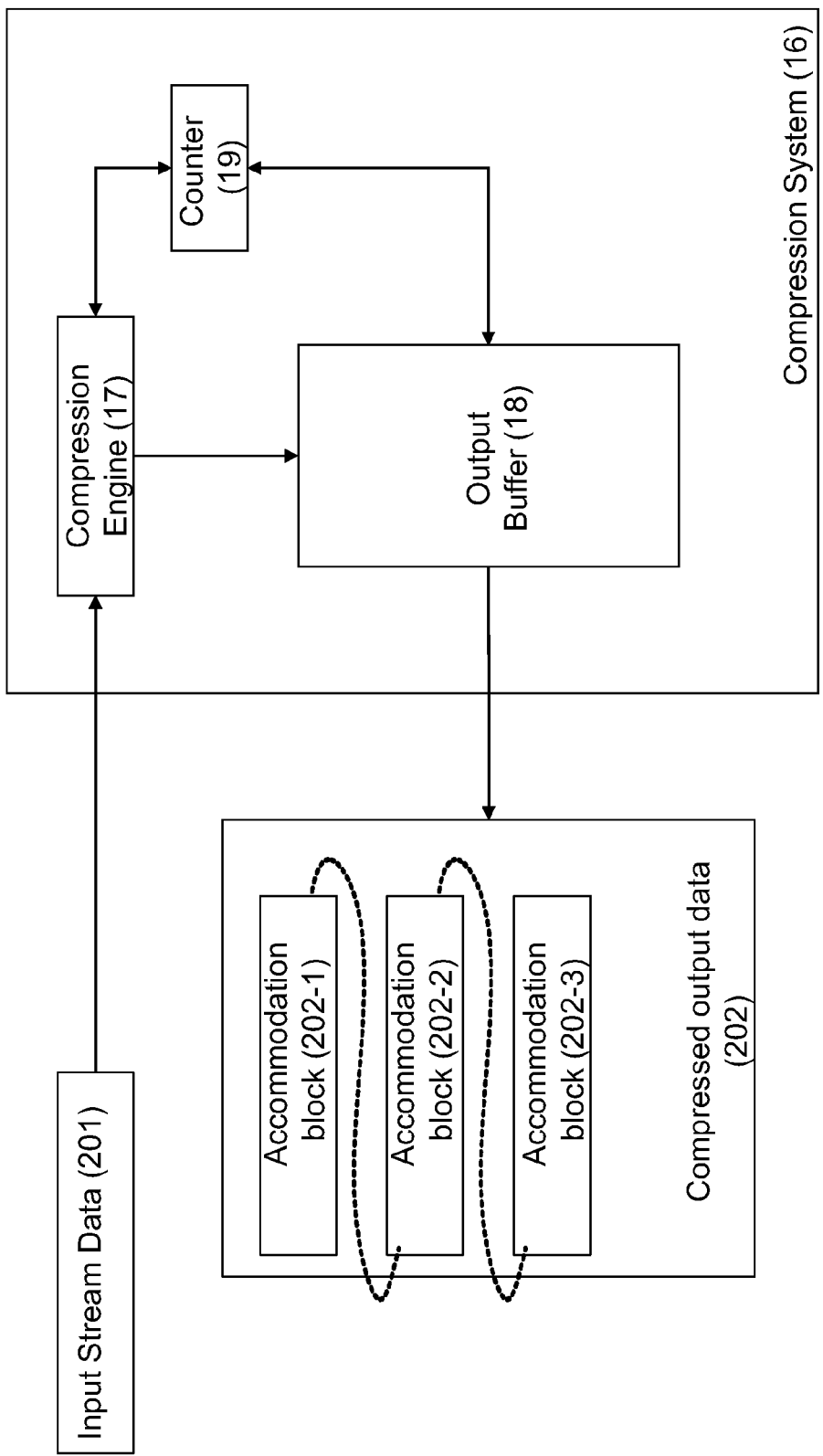
FIG. 2 schematically illustrates an overall compression process in accordance with certain embodiments of the present invention.

FIG. 2 schematically illustrates an overall compression process in accordance with certain embodiments of the present invention. The compression engine 17 fetches input data 201 and compresses them with the help of a sequential algorithm into output data 202. The output data are stored in one or more accommodation blocks. The counter 19 keeps track of the actual size of input bytes successfully encoded into a current accommodation block (e.g. 202-1), and is initialized before start of compressing data to be accommodated in a next accommodation block (e.g. 202-2). The term "initialize" used in this patent specification should be expansively construed to include assigning any starting value or handling a previously gained value as a starting value.

Figure 3:
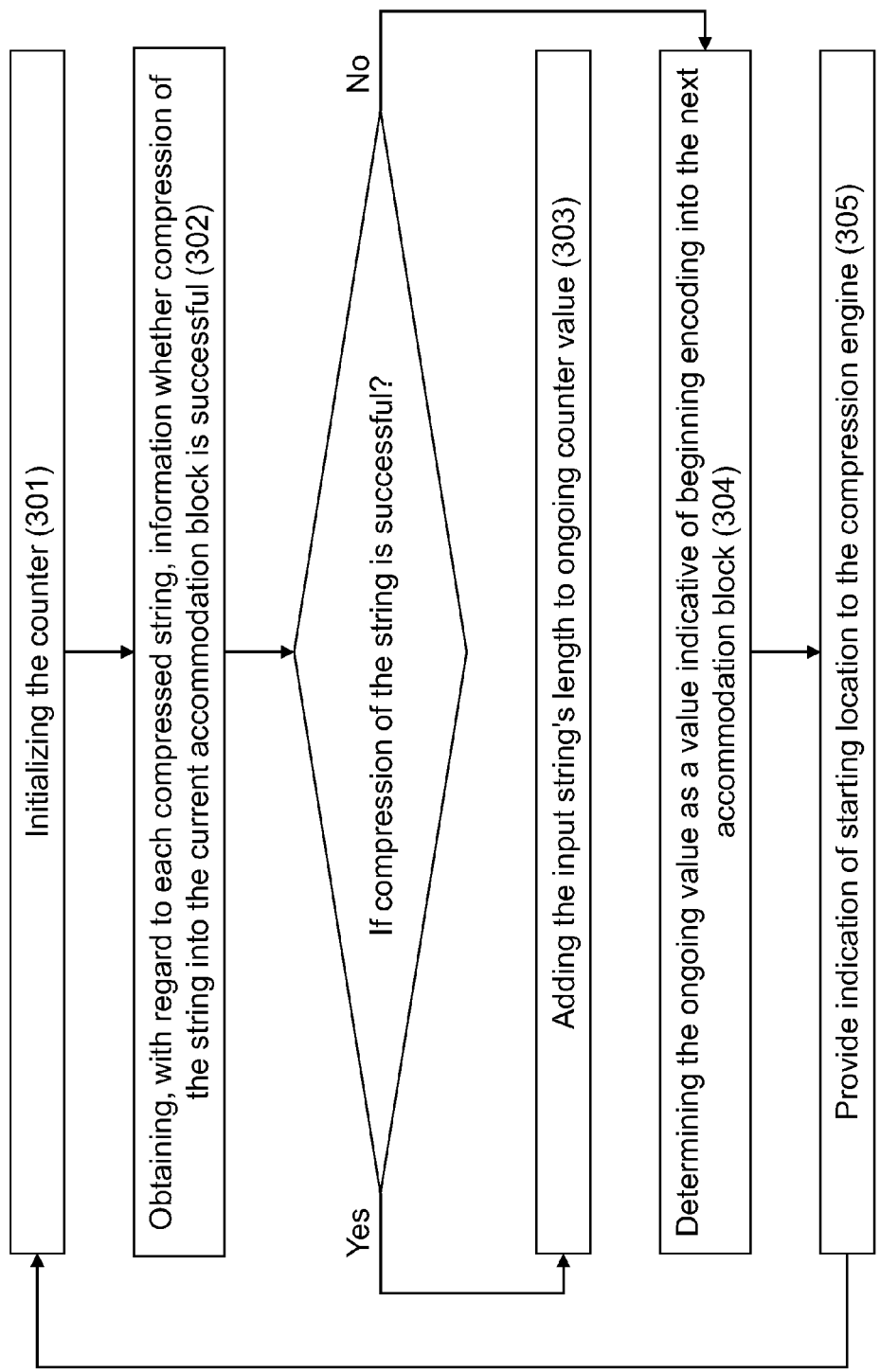
FIG. 3 illustrates a generalized flow-chart of operating a counter in accordance with certain embodiments of the present invention.

FIG. 3 illustrates the operation of the counter. The counter is initialized (301) before start of compressing into a given accommodation block. Each time the compression engine encodes a new input string (including one-character long string), the counter obtains (302) information whether the compression of the string is successful.

The compression of a given string into a given accommodation block is considered to be unsuccessful if respected encoded output has been truncated at the block boundary. Alternatively or additionally, the string compression is considered to be unsuccessful if the encoded output of the string is expected to be unsuccessful, i.e. if there is estimated insufficient available space in the current accommodation block for accommodating respective encoded data.

If the compression of the string is successful, the input string's length is added to the ongoing counter value (303).

If the compression of the string is unsuccessful (i.e. the string has been truncated and/or is expected to be truncated), the counter determines (304) the ongoing value as a value indicative of starting point in the input stream to be encoded into the next accommodation block.

Responsive to unsuccessful compression, the counter further provides (305) (in pull or push mode) the compression engine with information indicative of starting point in the input stream for encoding into the next accommodation block, such information is referred to hereinafter as "start indication".

In certain embodiments of the invention, the counter may provide its ongoing value to the compression engine responsive to successful compression of each string, while the start indication may comprise information that the previously provided ongoing value characterizes the overall actual size of input data successfully compressed into a given accommodation block and, accordingly, the point in the input stream for start of encoding into the next accommodation block. Alternatively or additionally, the start indication may comprise value characterizing the overall actual size of input data successfully compressed into a given accommodation block, e.g. ongoing value of the counter updated responsive to the last successfully encoding into the current accommodation block.

Alternatively, in certain embodiments of the invention the counter may update the compression engine only responsive to unsuccessful compression, wherein the provided start indication comprises value characterizing the overall actual size of input data successfully compressed into a given accommodation block.

The compression engine starts compression into the next accommodation block in accordance with start indication obtained from the counter.

The counter may obtain information indicative of unsuccessful compression of the string in different ways. By way of non-limiting example, the information indicative of unsuccessful compression may be based on a fact of truncation the respective string's encoding at the block boundary. Accordingly, the counter may receive from the compression engine information about provided truncation of a certain string at the block boundary and, accordingly, may handle this string as unsuccessfully compressed. By way of another non-limiting example, the information may be based on estimation of available space in the current accommodation block. Accordingly, the compression engine may be configured to keep information about the size of compressed data currently accommodated in the accommodation block; to estimate an expected size of the next string after compression, to estimate the availability of storage space in current accommodation block, and to inform the counter in a push or pull mode. Those versed in the art will readily appreciate that, alternatively, calculations of availability may be provided by the counter in accordance with information about the size of currently accommodated compressed data and expected size of the string after compression, said data may be obtained from the compression engine.

Figure 4:
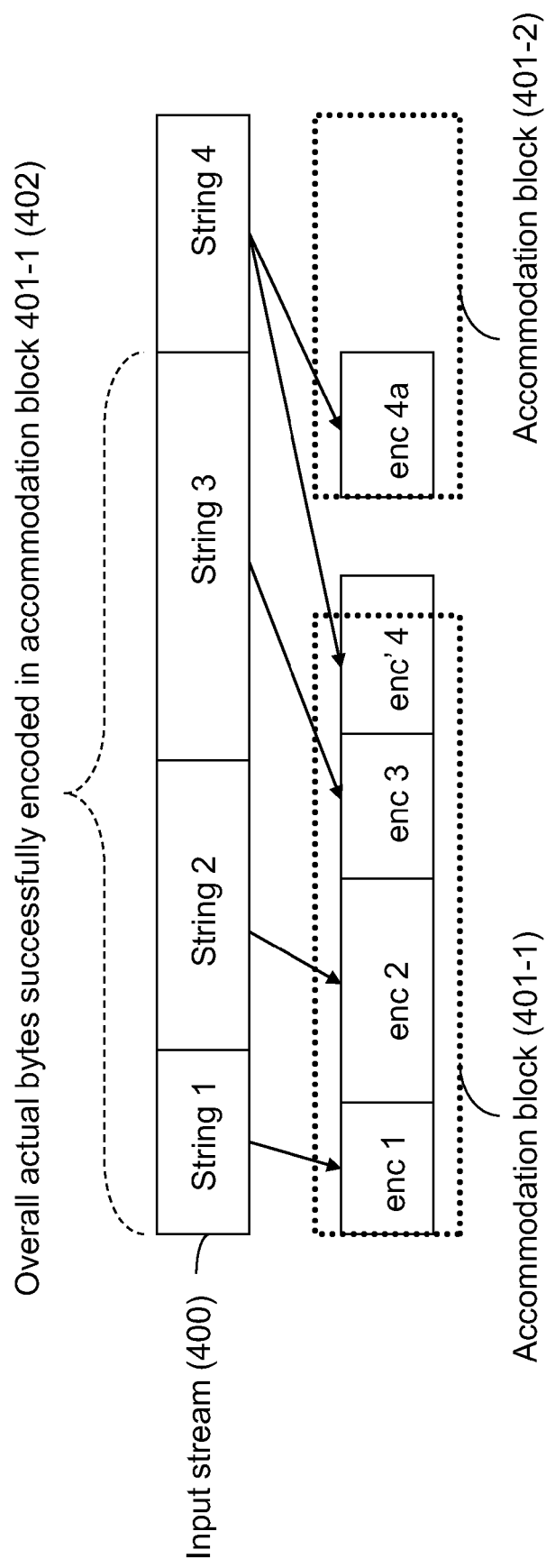
FIG. 4 schematically illustrates a sequential compression algorithm implemented in accordance with certain embodiments of the present invention.

FIG. 4 illustrates a sequential compression algorithm implemented in accordance with certain embodiments of the present invention. An input stream 400 is divided by the compression engine into strings. Strings illustrated as "string1", "string2" and "string3" have been successfully encoded into the accommodation block 401-1 with corresponding output encodings "enc 1", "enc2" and enc3". In the illustrated example there is no sufficient space for successful encoding of "string4" in the accommodation block 401-1, thus the respective encoding will be truncated in accordance with the predefined size of accommodation block 401-1 and only a part of encoded "string4" (illustrated as "enc'4") will be accommodated in the block 401-1. Accordingly, responsive to unsuccessful encoding of "string4", the counter will send to the compression engine the start indication characterizing the end of overall bytes (402) successfully compressed into the accommodation block 401-1 and, accordingly, the starting point for compression into the accommodation block 401-2. The value of the counter will characterize the total length of the first three strings ("string1", "string2" and "string3"), which have been successfully encoded. The compression engine further continues compression into accommodation block 401-2, and encodes the unsuccessfully encoded "string4" into to "enc4a". When the accommodation block 401-1 is later decompressed (e.g. responsive to "read" request), unsuccessful partial encodings such as "enc'4" is translated into empty strings.

Those skilled in the art will readily appreciate that the invention may be implemented in various ways. By way of non-limiting example the data may be written directly to the accommodation blocks (with no buffering in the compression system or with minimal buffering required for compressing a string). In such an example, the counter, in a manner described above, keeps track of actual number of input bytes successfully encoded into a current accommodation block, and informs the compression engine accordingly. By way of another non-limiting example, the output buffer 18 of the compression system may be divided into one or more output blocks corresponding to one or more accommodation blocks. Data to be stored in a certain accommodation block is written in corresponding output buffer block and further conveyed to the respective accommodation block. The counter keeps track as described above of writing the compressed data in the respective output buffer blocks corresponding to the accommodation blocks, while the data may be conveyed for accommodation in accordance with different criteria (e.g. in block-after-block mode, upon completing all blocks in the buffer, in accordance with pre-defined run-up time, etc.).

By way of non-limiting example, in certain embodiments of the invention the counter and the compression engine may be implemented in different physical systems, e.g. the counter may be integrated with the storage system, while the compression engine may be stand-alone or integrated with the client.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present invention.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

Those skilled in the art will readily appreciate that various modifications and changes can be applied to the embodiments of the invention as hereinbefore described without departing from its scope, defined in and by the appended claims.

The invention claimed is:

1. A compression system configured to compress logical data objects into one or more accommodation blocks with a predefined size, the compression system comprising a compression engine capable of compressing input data with the help of sequential encoding one or more input strings and a counter operatively coupled to the compression engine, wherein the counter is configured:
   a. to keep its ongoing value indicative of a number of input bytes in one or more strings successfully encoded into a given accommodation block; and
   b. responsive to unsuccessful compression of a string into said given accommodation block, to provide the compression engine with information indicative of starting point in the input stream for encoding into the next accommodation block, thus giving rise to a "start indication".

2. The compression system of claim 1 wherein the counter is further configured:
   a. to obtain, with regard to each string compressed by the compression engine, information whether the compression of a given string into a given accommodation block is successful;
   b. responsive to successful compression of said given string into said given accommodation block, to add a value indicative of the actual number of input bytes in said given string to an ongoing counter value; and
   c. responsive to unsuccessful compression of said given string into said given accommodation block, to generate the start indication informative of the overall actual number of input bytes in all strings successfully encoded into the given accommodation block.

3. The compression system of claim 2 wherein the counter is further configured to provide the compression engine with respectively updated ongoing counter value responsive to successful compression of each given string into said given accommodation block.

4. The compression system of claim 1 wherein at least one string comprises merely one character.

5. The compression system of claim 1 wherein compression of a string into a given accommodation block is considered as unsuccessful when matching at least one criterion selected from the group comprising:
   a. encoded output of said string has been truncated at boundary of said given block; and
   b. encoded output of said string is expected to be truncated at boundary of said given block.

6. The compression system of claim 1 wherein the compression engine is further configured to send in a push mode to the counter, information indicative of unsuccessful compression of a given string.

7. The compression system of claim 1 wherein the counter is further configured to generate information indicative of unsuccessful compression of a given string, said generation based on data obtained from the compression engine and related to encoded data.

8. The compression system of claim 1 further comprising an output buffer operatively coupled to the compression engine and to the counter,
   a. wherein the output buffer is divided into one or more output buffer blocks corresponding to one or more accommodation blocks and configured to accommodate encoded output data for further conveying to the respective accommodation block; and
   b. wherein compressing a string into a given accommodation block is considered as unsuccessful when matching at least one criterion selected from the group comprising:
      i. encoded output of said string has been truncated at the boundary of corresponding output buffer block; and
      ii. encoded output of said string is expected to be truncated at the boundary of corresponding output buffer block.

9. The system of claim 1 at least partly integrated with a communication device operable in a storage network.

10. The system of claim 1 at least partly integrated with a storage device operable in a storage network.

11. The system of claim 1 operatively coupled in a serial manner to a storage device, said system acting as a transparent bridge in respect to the storing encoded data.

12. The system of claim 1 operable with at least file access storage protocol.

13. The system of claim 1 operable with at least block mode access storage protocol.

14. A method of compressing logical data objects into one or more accommodation blocks with a predefined size, the method comprising:
   a. compressing input data with the help of sequential encoding one or more input strings, thus giving rise to encoded output data;
   b. counting an ongoing value indicative of a number of input bytes in one or more strings successfully encoded into a given accommodation block;
   c. responsive to unsuccessful compression of a string into said given accommodation block, generating information indicative of starting point in the input stream for encoding into the next accommodation block, thus giving rise to a "start indication", wherein said generation is provided without decompression of said given accommodation block; and d. starting compression into a next accommodation block in accordance with the generated start indication.

15. The method of claim 14 further comprising:
   a. obtaining with regard to each compressed string, information whether the compression of a given string into a given accommodation block is successful;
   b. responsive to successful compression of said given string into said given accommodation block, adding a value indicative of the actual number of input bytes in said given string to the ongoing counter value; and
   c. responsive to unsuccessful compression of said given string into said given accommodation block, generating the start indication informative of the overall actual number of input bytes in all strings successfully encoded into the given accommodation block.

16. The method of claim 14 wherein compression of a string into a given accommodation block is considered as unsuccessful when matching at least one criterion selected from the group comprising:
   a. encoded output of said string has been truncated at the boundary of said given block; and
   b. encoded output of said string is expected to be truncated at the boundary of said given block.

17. The method of claim 14 further comprising accommodating encoded data in one or more output buffer blocks corresponding to one or more accommodation blocks for further conveying to the respective accommodation block; wherein compressing a string into a given accommodation block is considered as unsuccessful when matching at least one criterion selected from the group comprising:
   a. encoded output of said string has been truncated at the boundary of corresponding output buffer block; and
   b. encoded output of said string is expected to be truncated at the boundary of corresponding output buffer block.

18. The method of claim 14 operable with a communication device in a storage network.

19. The method of claim 14 operable with a storage device in a storage network.

20. The method of claim 14 operable with a system capable of compressing a logical data object for storage in a storage device operatively coupled to the system in a serial manner, said system acting as a transparent bridge in respect to the storing data.

21. The method of claim 14 operable with at least file access storage protocol.

22. The method of claim 14 operable with at least block mode access storage protocol.

23. A computer program comprising computer program code means for performing all the steps of claim 14 when said program is run on a computer.

24. A computer program as claimed in claim 23 embodied on a computer readable medium.

25. A method of compressing a logical data objects into one or more accommodation blocks with a predefined size, the method comprising:
   a. compressing input data with the help of a sequential compressing algorithm;
   b. keeping track of an actual number of successfully encoded input bytes while compressing to a certain accommodation block; and
   c. compressing into a next accommodation block in accordance with said actual number.

* * * * *